(12) United States Patent
Schläfli

(10) Patent No.: US 11,215,644 B2
(45) Date of Patent: Jan. 4, 2022

(54) ELECTRICAL CURRENT TRANSDUCER WITH MAGNETIC FIELD GRADIENT SENSOR

(71) Applicant: LEM Intellectual Property SA, Fribourg (CH)

(72) Inventor: Dominik Schläfli, Nyon (CH)

(73) Assignee: LEM INTERNATIONAL SA, Plan-les-Ouates (CH)

( * ) Notice: Subject to any disclaimer, the term of this patent is extended or adjusted under 35 U.S.C. 154(b) by 133 days.

(21) Appl. No.: 16/494,034

(22) PCT Filed: Mar. 13, 2018

(86) PCT No.: PCT/EP2018/056131
§ 371 (c)(1),
(2) Date: Sep. 13, 2019

(87) PCT Pub. No.: WO2018/166995
PCT Pub. Date: Sep. 20, 2018

(65) Prior Publication Data
US 2020/0088768 A1    Mar. 19, 2020

(30) Foreign Application Priority Data

Mar. 16, 2017  (EP) ..................................... 17161460

(51) Int. Cl.
*G01R 33/00*  (2006.01)
*G01R 15/18*  (2006.01)
*G01R 33/022*  (2006.01)

(52) U.S. Cl.
CPC ........ *G01R 15/181* (2013.01); *G01R 33/0011* (2013.01); *G01R 33/022* (2013.01)

(58) Field of Classification Search
CPC . G01R 15/181; G01R 33/0011; G01R 33/022
(Continued)

(56) References Cited

U.S. PATENT DOCUMENTS 5,621,377 A   4/1997  Dettmann
6,366,076 B1 * 4/2002  Karrer ................. G01R 15/181
                                                    324/117 R
(Continued)

FOREIGN PATENT DOCUMENTS

EP         2653876        10/2013
WO     WO 2008/030129      3/2008
(Continued)

OTHER PUBLICATIONS

International Search Report issued by the European Patent Office, dated Aug. 27, 2018, for International Patent Application No. PCT/EP2018/056131; 7 pages.
(Continued)

*Primary Examiner* — Huy Q Phan
*Assistant Examiner* — Courtney G McDonnough
(74) *Attorney, Agent, or Firm* — Faegre Drinker Biddle & Reath LLP

(57) ABSTRACT

Current transducer comprising a section of a primary conductor and a magnetic field gradient sensor mounted in proximity to the primary conductor configured to measure a magnetic field gradient in a gradient measurement direction transverse to a direction of flow of a primary current flowing in the primary conductor. The current transducer further comprises a first lateral magnetic shim mounted adjacent a first outer side of the primary conductor, and a second lateral magnetic shim mounted adjacent a second outer side of the primary conductor, a major internal surface of the first and second magnetic shims facing the magnetic field gradient sensor and extending essentially parallel to the direction of flow of the primary current.

27 Claims, 12 Drawing Sheets

(58) Field of Classification Search
USPC .......................................................... 324/126
See application file for complete search history.

(56) References Cited

U.S. PATENT DOCUMENTS

| | | | |
|---|---|---|---|
| 6,636,029 B1 * | 10/2003 | Kunze | G01R 15/207 |
| | | | 324/117 H |
| 2004/0008022 A1 | 1/2004 | Viola | |
| 2004/0201373 A1 | 10/2004 | Kato | |
| 2005/0253573 A1 | 11/2005 | Budillon | |
| 2009/0289694 A1 | 11/2009 | Rieger | |
| 2012/0161756 A1 * | 6/2012 | Paci | B82Y 25/00 |
| | | | 324/228 |

FOREIGN PATENT DOCUMENTS

| | | | |
|---|---|---|---|
| WO | WO-2008030129 A2 * | 3/2008 | G01R 15/207 |
| WO | WO 2011/097045 | 8/2011 | |
| WO | WO 2013/010599 | 1/2013 | |
| WO | WO 2013/181458 | 12/2013 | |

OTHER PUBLICATIONS

Written Opinion issued by the International Searching Authority, dated Aug. 27, 2018, for International Patent Application No. PCT/EP2018/056131; 11 pages.

* cited by examiner

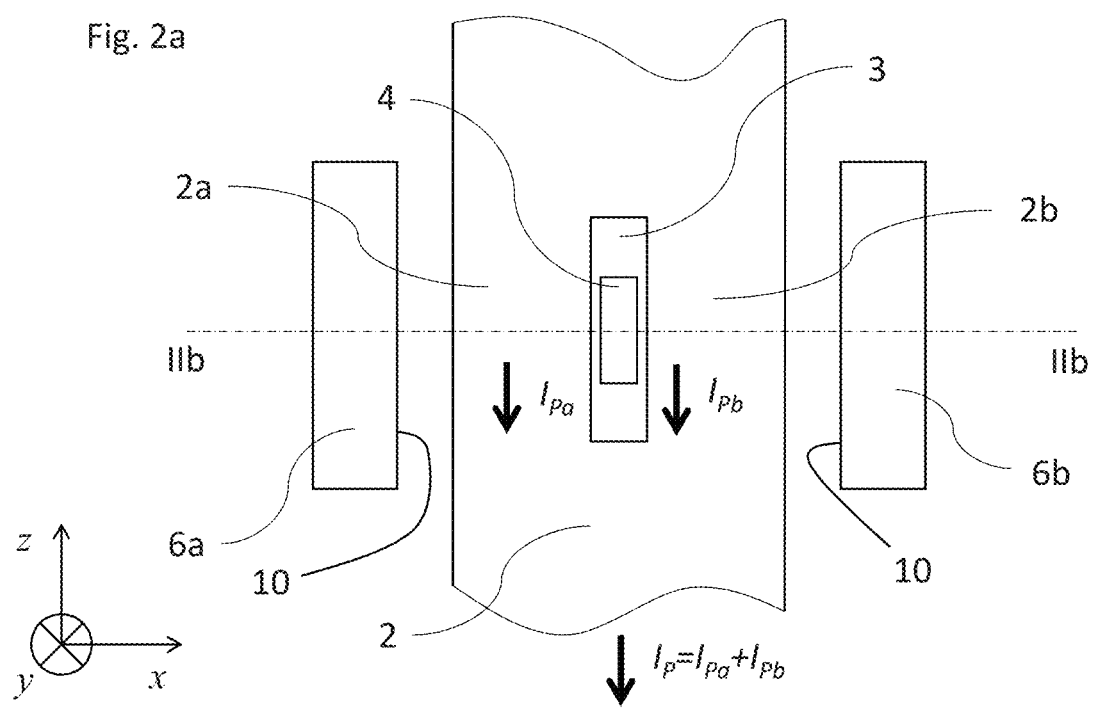

a.

b.

ELECTRICAL CURRENT TRANSDUCER WITH MAGNETIC FIELD GRADIENT SENSOR

CROSS-REFERENCE TO RELATED APPLICATIONS

The present application is a national stage entry of International (PCT) Patent Application Number PCT/EP2018/056131, filed Mar. 13, 2018, which in turn claims priority to European Patent Application No. 17161460.5, filed Mar. 16, 2017, the subject matter of which are expressly incorporated herein by reference.

The present invention relates to an electrical current transducer with a magnetic field gradient sensor for measuring an electrical current flowing in a conductor.

An electrical current transducer with a magnetic field gradient sensor for measuring an electrical current flowing in a conductor is described in U.S. Pat. Nos. 6,040,690 and 6,636,029. In such a transducer, a conductor carrying a current is split into two parallel sections separated by a gap, each of these parallel conductors carrying about half the total current. This can be done with separate conductors, or by creating a hole or slot in a conductor bus bar. Referring to FIG. 1a, the magnetic field produced in the gap 3 by the primary current $I_P$ to be measured has the property of being proportional to the primary current $I_P$, but spatially inhomogeneous, with a substantially constant gradient along two orthogonal directions dBy/dx and dBx/dy, assuming current flows in a z direction. This gradient can be measured by two magnetic sensors 4a, 4b spaced some distance apart and with their respective axis of sensitivity $X_a$, $X_b$ oriented in opposite directions, whose outputs, when added together by a summing amplifier, provide a signal proportional to the current to be measured.

A first drawback of the above described known current transducer is its limited and variable frequency response and response time. The sensitivity of the known transducer depends on magnetic coupling of the primary current to the magnetic field sensors. As frequency increases, skin and proximity effect change the distribution of current in the primary conductor, resulting in a varying magnetic coupling and reduced sensitivity. This effect is dependent on the magnetic constant mu0, and on the bus bar resistivity. In the case of copper, the resistivity can vary by more than 40% over the typical operating temperature range. The frequency response of the transducer will also vary accordingly with temperature, making it impractical to compensate such a frequency response variation through simple signal processing methods.

A second drawback of the above described known current transducer is its sensitivity to external magnetic field gradients.

If a known current transducer arrangement is placed in a homogenous magnetic field, the perturbing field would add equal but opposite contributions to each magnetic field sensor output that thus cancel each other out when summed, provided that locally the sum of the perturbing homogenous field and the gradient field created by the current does not exceed the linear range of the magnetic sensors. However, homogenous external fields are usually the exception rather than the rule, and in most applications cables, inductors or transformers will produce strong and inhomogeneous fields. The field gradient produced by these sources at the location of the pair of magnetic field sensors used in the current transducer described above is indistinguishable from the field gradient produced by the current to be measured. External inhomogeneous magnetic fields will result in errors on the current transducer output.

It is known to provide magnetic circuits to increase the flux density in the magnetic field gradient sensor for a given primary current, as described for instance in U.S. Pat. No. 6,636,029 or WO2008030129.

In U.S. Pat. No. 6,636,029, the magnetic circuit has essentially C shaped cores that surround sections of the primary conductor, each C shaped core forming an air gap that concentrates the magnetic flux generated by the primary current in the slot in which the magnetic gradient sensor is positioned. The C shaped cores increase the cost and volume of the transducer, compared to transducers without cores, not only because of the relative complexity of the cores and the assembly thereof to the primary conductor, but also taking into account the required thickness of core material to be able to carry the flux density generated by the primary current without saturating. The magnetic core may also increase non linearity and magnetic offset due to the length of the flux path through the material, and the flux excursion during operation.

In WO2008030129, a transducer with a simpler magnetic circuit is described, however the problems of amount of core material needed and non-linearity subsist. Also, the gradient sensor comprises two separate magnetic field detectors mounted on opposite sides of the primary conductor bar which increases exposure of the gradient sensor to external fields and increases problems due to differences in temperature or other environmental conditions at different sides of the primary conductor, compared to a single magnetic field gradient sensor positioned in a slot of the primary conductor.

Moreover, in both U.S. Pat. No. 6,636,029 or WO2008030129, the ability to measure currents over a large frequency range is limited.

It is generally known to provide a current transducer that combines the measurement from a Rogowski coil and a plurality of discrete magnetic field detectors positioned around a primary conductor as described in U.S. Pat. No. 6,366,076. The plurality of discrete detectors however may lead to problems of differing offsets and differences in temperature or other environmental conditions around the primary conductor such that the measurement signal formed by a combination of the signals from the plurality of detectors is adversely affected.

In view of the foregoing, it is an object of this invention to provide an electrical current transducer for measuring an electrical current flowing in a conductor that is accurate, reliable and has a large measurement range.

It is advantageous to provide an electrical current transducer that is accurate in varying thermal and environmental conditions.

It is advantageous to provide an electrical current transducer that is able to measure electrical currents accurately over a large frequency range.

It is advantageous to provide an electrical current transducer that is insensitive to external magnetic fields.

It is advantageous to provide an electrical current transducer that is compact and cost effective to manufacture.

Various objects of this invention have been achieved by providing the current transducer according to claim 1.

Various objects of this invention have been achieved by providing the current transducer according to claim 12.

Various objects of this invention have been achieved by providing the current transducer according to claim 19.

Disclosed herein is a current transducer comprising a section of a primary conductor and a magnetic field gradient sensor mounted in proximity to the primary conductor configured to measure a magnetic field gradient in a gradient measurement direction (Y, X) transverse to a direction of flow (Z) of a primary current ($I_P$) flowing in the primary conductor that enables measurement of said primary current ($I_P$).

According to a first aspect of the invention, the current transducer further comprises a first lateral magnetic shim mounted adjacent a first outer side of the primary conductor, and a second lateral magnetic shim mounted adjacent a second outer side of the primary conductor opposite the first outer side, a major internal surface of the first and second magnetic shims facing the magnetic field gradient sensor and extending essentially parallel to the current flow direction (Z), wherein the current transducer further comprises a first branch of a Rogowski coil mounted adjacent a third outer side of the primary conductor extending between the first and second lateral shims, and a second branch of a Rogowski coil mounted adjacent a fourth outer side, opposite the third outer side, of the primary conductor extending between the first and second lateral shims.

According to a second aspect of the invention, the current transducer comprises a first magnetic field sensing system configured for measurement of a primary current flowing in the primary conductor in a lower frequency range, and a Rogowski coil encircling said primary conductor configured for measuring said primary current in an upper frequency range having frequencies greater than the lower frequency range, wherein the first magnetic field sensing system comprises the magnetic field gradient sensor which is mounted in a slot midway between two portions of said section of primary conductor, the magnetic field gradient sensor configured to measure a magnetic field gradient in a gradient measurement direction (Y) transverse to a direction of flow (Z) of the primary current ($I_P$).

In the above two aspects, the combination of a magnetic field gradient sensor with a Rogowski coil in a current transducer is surprisingly advantageous to obtain a large amplitude and frequency measurement range while providing a compact and cost effective transducer with improved linearity and more stable and accurate measurement compared to either conventional transducers with multiple magnetic field detectors or conventional transducers with gradient sensors.

In an advantageous embodiment, the magnetic field gradient sensor is positioned in a slot midway between two portions of said section of primary conductor.

In another embodiment, at least first and second magnetic field detectors may be positioned on opposite sides of said section of primary conductor.

According to a third aspect of the invention, the magnetic field gradient sensor of the current transducer is mounted in a slot midway between two portions of said section of primary conductor, the transducer further comprising a first lateral magnetic shim mounted adjacent a first outer side of the primary conductor, and a second lateral magnetic shim mounted adjacent a second outer side of the primary conductor opposite the first outer side, a major internal surface of the first and second magnetic shims facing the magnetic field gradient sensor and extending essentially parallel to the current flow direction (Z), the first and second lateral magnetic shims being substantially parallel, the magnetic shims arranged to attenuate the influence of external magnetic field gradients without increasing flux density generated by the primary current in the slot.

In the above invention aspects having magnetic shims that are arranged to attenuate the influence of external magnetic fields without (substantially) increasing flux density generated by the primary current on the magnetic gradient sensor, improve accuracy and performance in the presence of external magnetic fields while reducing the complexity of the transducer compared to conventional transducers provided with magnetic circuits that serve to concentrate the magnetic flux of the primary conductor on the magnetic field sensor, even if such circuits may also attenuate external magnetic fields. One of the problems of the aforementioned conventional transducers is the need for a magnetic circuit that can carry the magnetic flux generated by the primary current without saturating, and to have a design that provides an airgap, thus leading to increased cost and complexity. Moreover the flux concentrating magnetic circuits, in comparison to magnetic shims that serve principally or only to attenuate the influence of external magnetic fields, may lead to increased non linearity and magnetic offset due to the length of the flux path through the material, and the flux excursion during operation.

In advantageous embodiments of the abovementioned aspects of the invention, the magnetic field gradient sensor comprises a first magnetic field detector oriented to sense magnetic flux in a first magnetic field direction (Xa) transverse to the direction of flow (Z) of the primary current $I_P$, and a second magnetic field detector oriented to sense magnetic flux in a second magnetic field direction (Xb) parallel but opposite to the first magnetic field direction, the first and second magnetic field detectors separated by a non zero distance along the gradient measurement direction (Y).

In advantageous embodiments of the abovementioned aspects of the invention, the magnetic shims may be substantially planar.

In advantageous embodiments of the abovementioned aspects of the invention, the magnetic shims are arranged substantially parallel to said gradient measurement direction (Y).

In advantageous embodiments of the abovementioned aspects of the invention, the primary conductor section is in the form of a section of solid bus bar incorporated in the electrical current transducer.

In advantageous embodiments of the abovementioned aspects of the invention, the section of solid bus bar has a non-circular shape defining a width W between said first and second opposed outer sides, and a height H between said third and fourth opposed outer sides, and the height being smaller than the width H<W.

In advantageous embodiments of the abovementioned aspects of the invention, the section of solid bus bar has a substantially rectangular shape.

In advantageous embodiments of the abovementioned aspects of the invention, the magnetic field gradient sensor is positioned in a slot midway between two portions of said section of primary conductor, said slot extending between said first and second sides.

In advantageous embodiments of the abovementioned aspects of the invention, the first and second magnetic field detectors are formed in a single component, for instance in a single ASIC. This feature not only reduces costs, but also reduces the adverse effects of different temperatures, electrical or magnetic fields and other factors at different locations that affect multi sensor arrangements.

Alternatively, in certain embodiments, said at least first and second magnetic field detectors are not inside a slot but separate components positioned outside said section of primary conductor, adjacent first and second outer sides of the primary conductor.

In advantageous embodiments of the abovementioned aspects of the invention, a height (Hm) of the magnetic shims is at least 1.5 times, preferably at least 2 times a height (H) of the section of solid bus bar of the primary conductor, measured in the gradient direction Y. This feature advantageously ensures a good attenuation of the external magnetic field and reduces any distortion of the magnetic field uniformity between the shims at the level of the primary conductor and in particular at the level of the magnetic field gradient sensor.

Further objects and advantageous aspects of the invention will be apparent from the claims, the following detailed description, and drawings in which:

FIG. 2a is a simplified view of a primary conductor and electrical current transducer with magnetic field gradient sensor according to an embodiment of the invention, and FIG. 2b is a cross-sectional view through line IIb-IIb of FIG. 2a;

FIG. 3b is a cross-sectional view through line IIIb-IIIb of FIG. 3a;

FIG. 5b is a cross-sectional view through line Vb-Vb of FIG. 5a;

Figure 7:
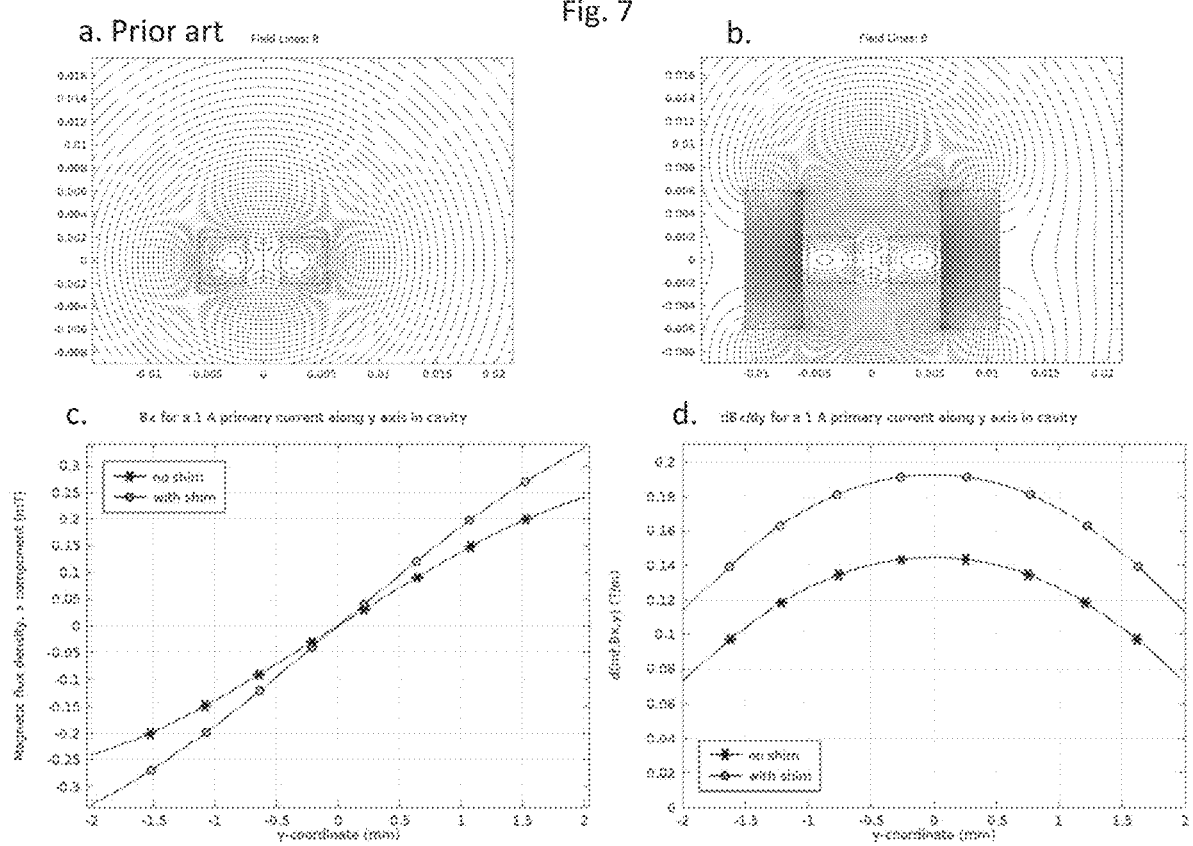
Figure 8:
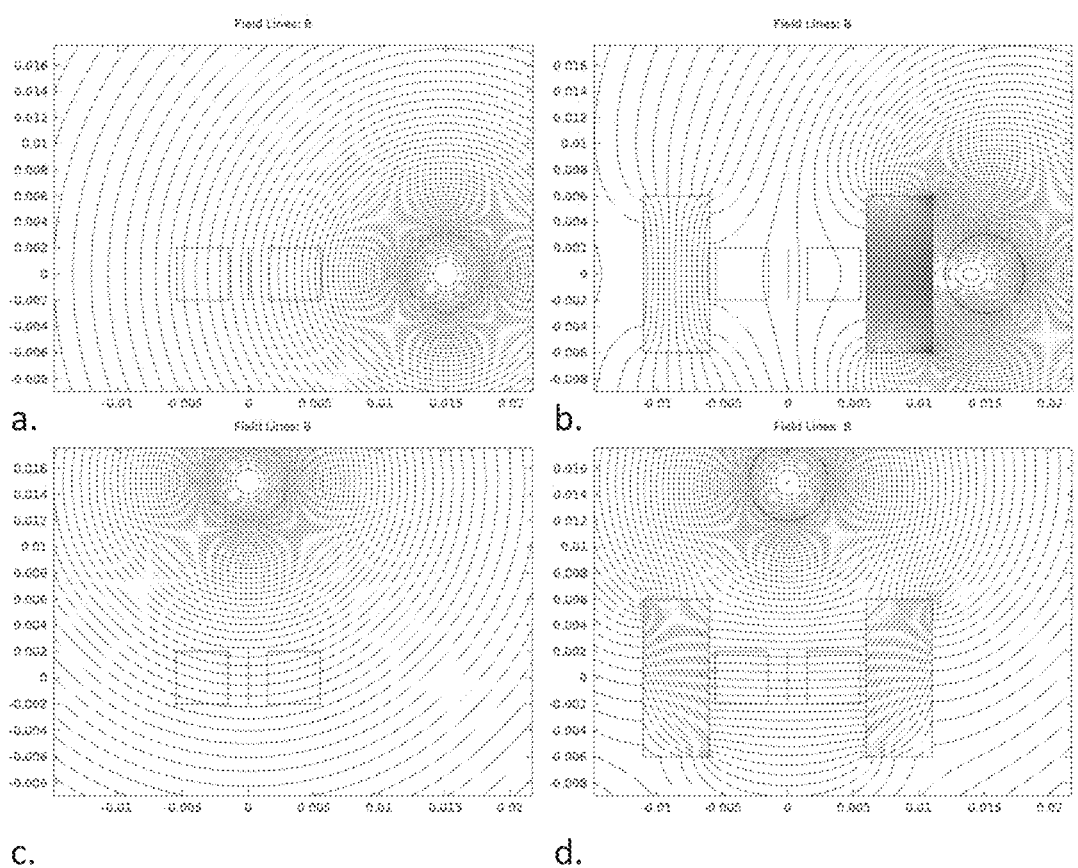
Figure 9:
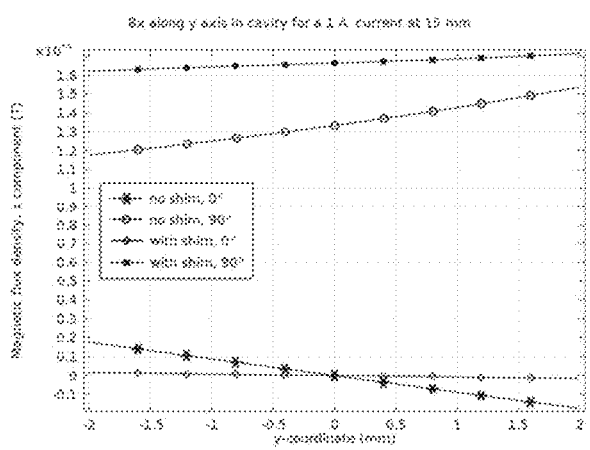
Figure 9:
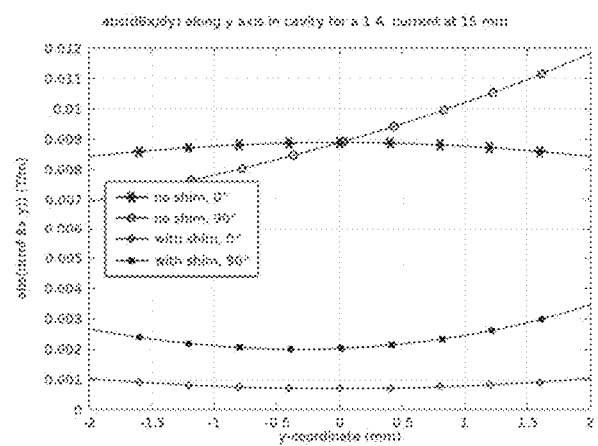

FIG. 7a illustrates magnetic field lines around a primary conductor with two sections separated by a gap (according to the prior art) and FIG. 7b is a similar illustration of magnetic field lines around a primary conductor with two sections separated by a gap according to an embodiment of the invention, and FIGS. 7c and 7b are graphs of magnetic flux density (FIG. 7c) respectively dBx/dy (FIG. 7d) versus the position along the y axis at the centre of the gap of the primary conductors of FIGS. 7a and 7c;

FIGS. 8a and 8c illustrate the magnetic field lines of an external conductor and its effect on the conventional arrangement of FIG. 7a, and FIGS. 8b and 8d illustrate the magnetic field lines of an external conductor and its effect on the arrangement according to an embodiment of the invention of FIG. 7b;

FIGS. 9a and 9b are graphs of magnetic flux density (FIG. 9a) respectively dBx/dy (FIG. 9b) versus the position along the y axis at the centre of the gap of the primary conductors of FIGS. 8a to 8d;

Referring to the figures, an electrical current transducer 1 according to this invention comprises a section of a primary conductor 2, for instance in the form of a bus bar, and a magnetic field gradient sensor 4, 4a, 4b mounted in proximity to the primary conductor. The magnetic field sensor is configured to measure a magnetic field gradient in a specific direction relative to the primary conductor that enables measurement of a primary current $I_P$ flowing in the primary conductor 2.

Figure 1A:
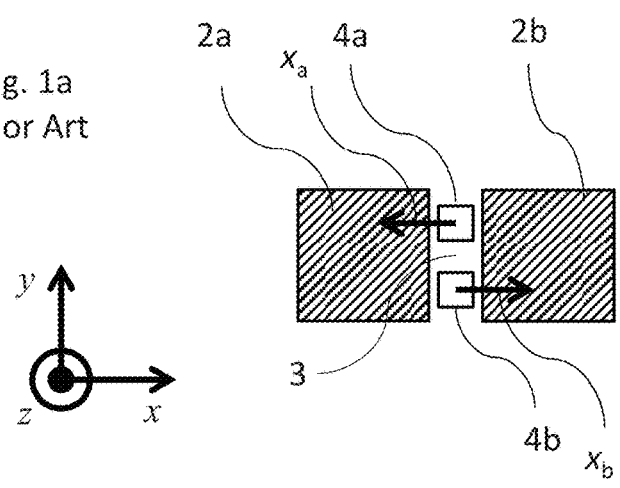
FIGS. 1a and 1b are simplified cross-sectional views of a primary conductor and magnetic field gradient sensors of conventional design.
Figure 1B:
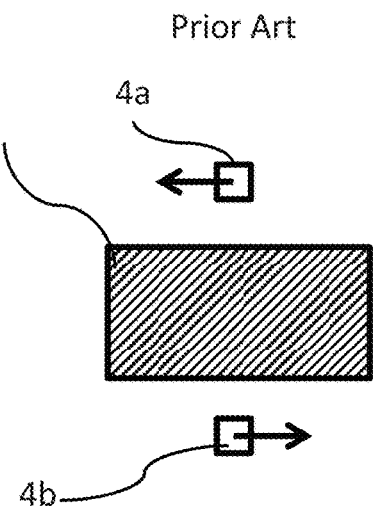

Typically, a magnetic field gradient sensor comprises at least two magnetic field detectors in positions spaced apart in said specific direction for measuring a difference in the magnetic field between the two positions. One example of a known arrangement is illustrated in FIG. 1a, where two magnetic field detectors 4a, 4b are positioned in a slot 3 between two portions 2a, 2b of the primary conductor. In another known example, illustrated in FIG. 1b, two magnetic field detectors 4a, 4b are positioned on opposite sides of the primary conductor 2. Other magnetic field sensor configurations able to measure a gradient are however also known. In the absence of external fields, the gradient of the magnetic field in the proximity of the primary conductor is proportional to the primary current $I_P$ (i.e. the current to be measured).

The principle of measuring a primary current flowing in a conductor using a magnetic field gradient measurement is per se well known and shall not be described in detail in the present.

The provision of a conductive bus bar incorporated in an electrical transducer for connection to a primary conductor is also per se well known, whereby details of the connection ends and mounting of a bus bar in a transducer may take various shapes and configurations per se known in the prior art and do not need to be further described herein.

Figure 2B:
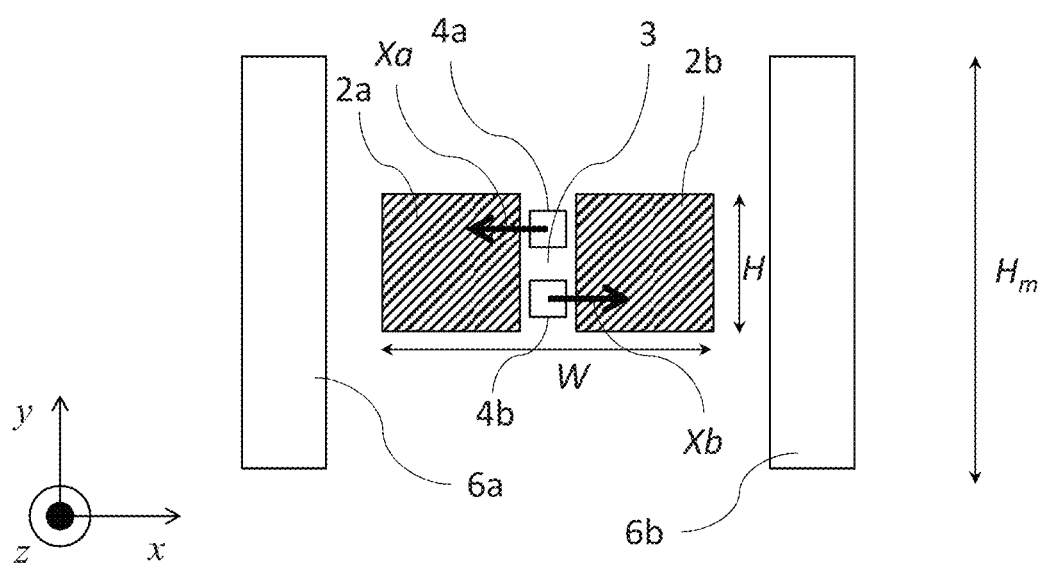

Referring to FIGS. 2a and 2b illustrating an embodiment of the invention, the magnetic field gradient sensor comprises a first magnetic field detector 4a and a second magnetic field detector 4b positioned in a slot 3 midway between two preferably essentially identical portions 2a, 2b of a primary conductor 2 that is may for instance be in the form of a section of solid bus bar incorporated in the electrical current transducer. The respective sensitivity directions Xa, Xb of the magnetic field detectors 2a, 2b are both oriented along the X axis, but in opposite directions. They sense the X component of the magnetic flux density B. The two sensing elements are separated by a small distance along the Y direction. When the electric outputs of the sensors are added together, the result is proportional to dBx/dy.

The electrical current transducer further comprises magnetic shims 6 mounted on outer sides of the primary conductor 2. In the illustrated embodiment, the magnetic shims include a first lateral magnetic shim 6a mounted adjacent an outer side of a first portion 2a of the primary conductor, and a second lateral magnetic shim 6b mounted adjacent an outer side of a second portion 2b of the primary conductor. A major internal surface 10 of the magnetic shims 6a, 6b, facing the magnetic field detectors 4a, 4b, extends essentially parallel to the portions 2a, 2b of a primary conductor 2 corresponding to a direction of flow of the primary current $I_P$. The magnetic shims are made of a material with high magnetic permeability and low magnetic reluctance, for instance a high permeability soft magnetic material such as soft iron, ferrite or permalloy, configured to redirect external magnetic fields between the shims. Because the magnetic shims provide a path of low resistance for the external magnetic field, the external magnetic field redirected between the opposed pair of magnetic shims is homogenized as best illustrated in FIGS. 8b and 8d. There is however an improved effect on the internal magnetic field generated by the primary conductor within the slot 3 between primary conductor portions 2a, 2b as best illustrated in FIGS. 7a and 7b. In FIGS. 7c and 7d, it can be seen that within the slot 3, where the magnetic field gradient sensors are mounted (at the coordinate X=0), the magnetic field gradient dBx/dy is somewhat amplified but remains proportional to the primary current similarly to the magnetic field gradient of the known system without magnetic shims illustrated in FIG. 7a. Moreover, as illustrated in FIGS. 8b and 8c (in conjunction with FIGS. 9a and 9b), external magnetic fields are either attenuated as seen in FIG. 8b compared to FIG. 8a, and/or homogenized to reduce the gradient along the y axis, as seen in FIG. 8d compared to FIG. 8c (in conjunction with FIGS. 9a and 9b). More specifically, FIG. 8a shows the field lines around the 2 square bus bar conductor portions each carrying the same current $I_P/2$. The vertical line in the slot between the two conductor portions indicates the axis on which the magnetic field sensors forming the gradient sensor are located, and over which the values shown in the line plots of FIGS. 8c and 8d are taken. FIG. 8b shows the effect of adding the shims to the situation shown in FIG. 8a. FIG. 8c shows the flux density x component along the y axis in the center of the slot, for both configurations. FIG. 8d shows dBx/dy along the same axis. There is only a small difference in sensitivity between configurations of FIG. 8a and FIG. 8b. Around the center of the axis, in first order approximation, the magnetic field gradient is essentially position independent.

In the specific example illustrated in FIG. 8, the bus bar is shown carrying zero current, and a neighboring current carrying conductor is positioned at a distance of 15 mm from the center of the current transducer assembly, shown in 2 angular positions, at 0° in 11a and 11b, and at 90° in 11c and 11d. The homogenizing effect on the X component of B is visible. FIG. 9a shows the X component of B along the slot axis. The common mode level is highest with shims and an external current neighbor at 90°, but in both cases with shims, the value of Bx along the axis is more constant than in the case without shims. This becomes clearly visible in FIG. 9b, which shows dBx/dy. With shims, in the illustrative case, rejection of inhomogeneous external fields can be improved in the order of about 5 to 10 times over conventional systems.

In the embodiment of FIGS. 2a, 2b, the soft magnetic parts 6a, 6b thus have at their inner surface 10 an essentially magnetic equipotential, and the volume between the parallel, inside facing surfaces 10 is occupied by a substantially homogenous magnetic field. Although the dBx/dy gradient may be lower than in the absence of the soft magnetic flux shapers formed by the magnetic shims 6a, 6b, the value of Bx can be slightly higher than in the absence of the shims. The purpose of the soft magnetic shims in this embodiment is to shape the flux density distribution to make it more uniform, not shield or screen the magnetic sensors in the usual sense, where it is understood to result in the shielded volume having a lowered magnitude of flux density compared with the surroundings.

In advantageous embodiments, the height Hm of the magnetic shims is preferably at least one and a half times (Hm>1.5H), preferably two times (Hm>2H), the height H of the section of solid bus bar of the primary conductor, measured in the direction Y of the magnetic field gradient. Preferably, the primary conductor and magnetic field gradient sensor are positioned substantially midway between ends of the magnetic shims defining the height Hm. This advantageously ensures a good attenuation of the external magnetic field and reduces any distortion of the magnetic field uniformity between the shims at the level of the primary conductor and in particular at the level of the magnetic field gradient sensor.

Figure 3A:
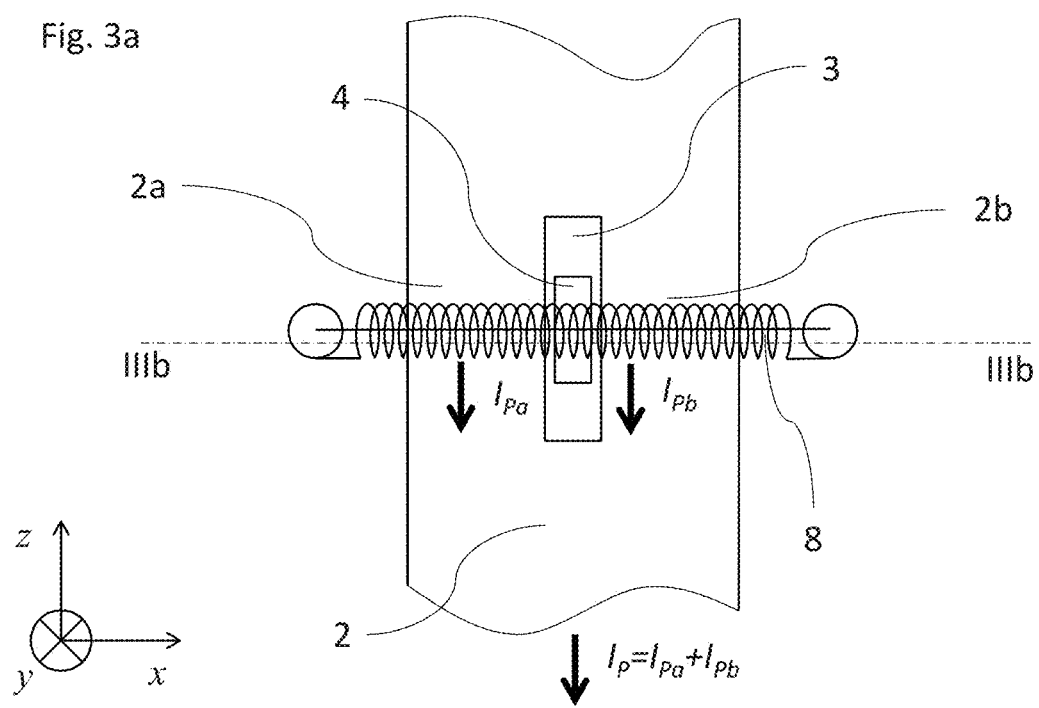
FIG. 3a is a simplified view of a primary conductor and electrical current transducer with magnetic field gradient sensor according to another embodiment of the invention.
Figure 3B:
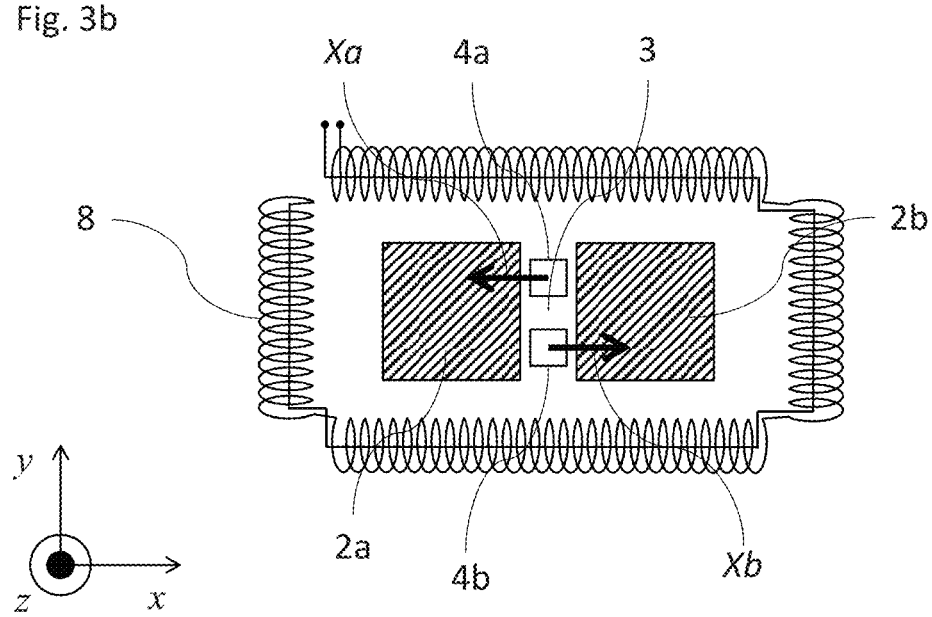

Referring now to FIGS. 3a and 3b, another embodiment of a current transducer according to the invention is illustrated. In this embodiment, the magnetic field gradient sensor comprises a first magnetic field detector 4a and a second magnetic field detector 4b positioned in a slot 3 midway between two essentially identical portions 2a, 2b of a primary conductor 2 that may for instance be in the form of a section of solid bus bar incorporated in the electrical current transducer. The respective sensitivity directions Xa, Xb of the magnetic field detectors 2a, 2b are both oriented along the X axis, but in opposite directions. They sense the X component of the magnetic flux density B. The two sensing elements are separated by a small distance along the Y direction. When the electric outputs of the sensors are added together, the result is proportional to dBx/dy. The electrical current transducer further comprises a Rogowski coil mounted around outer sides of the primary conductor 2. The magnetic field gradient sensor 4a, 4b measurement range is limited in its frequency response because the distribution of current density in a conductor bar varies with frequency (skin effect). The current distribution is dependent inter alia on conductor geometry, temperature and material properties, thus leading to a difficult to compensate behavior of the magnetic gradient measurement beyond a certain frequency. The Rogowski coil is however well adapted to measure the primary current $I_P$ flowing in the primary conductor 2a, 2b in a higher frequency range and complements well the magnetic field gradient sensors. In this embodiment, the magnetic field gradient sensors 4a, 4b thus measure the primary current from DC up to a first threshold frequency beyond which accuracy is no longer acceptable, whereas the Rogowski coil is configured to measure the primary current with an acceptable sensitivity from a second threshold frequency up to the upper cut-off frequency of the transducer. The first threshold frequency of the gradient sensors is higher than the second threshold frequency where the Rogowski coil becomes usable. This allows for a transition between the two signal sources to take place at a transition frequency located in between. The measurement signal processing circuit may be configured to cut off the signal of the Rogowski coil below the transition frequency, respectively to cut off the signal of the magnetic field gradient sensors 4a, 4b above the transition frequency.

Figure 4:
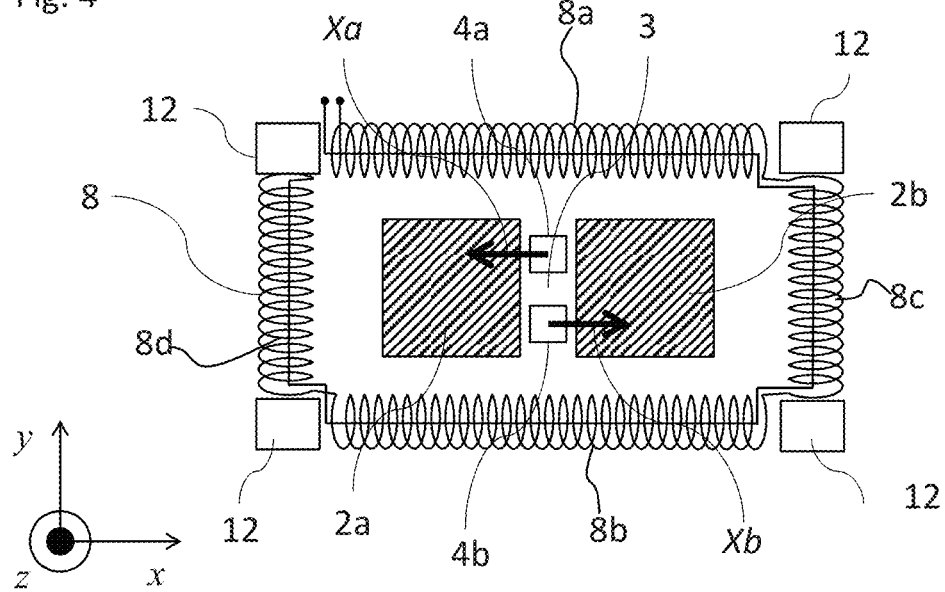
FIG. 4 is a cross-sectional view of a primary conductor and electrical current transducer with magnetic field gradient sensor according to a variant of FIG. 3b.

Various other ways of combining the outputs of the Rogowski coil and the magnetic field gradient sensors may be envisaged within the scope of the invention. Examples:
  Provide separate outputs and use the overlapping section of the frequency range for additional functions: e.g., if the current transducer is used to control the current, and the current is generated by switching followed by filtering, then a ripple is always present and may be located in the overlapping region of the spectrum. As the same signal is measured by both channels, the more stable of the two channels can be used to compensate temperature or other drifts of the sensitivity of the other channel;
  The same principle as above can also be used to monitor the function of the transducer by either using an already available signal like a ripple, or injecting a test signal like a pseudorandom sequence, and detecting the presence of the test signal in both channels;
  Provide a di/dt output for applications like sensorless position estimation where the di/dt is needed, and numerical derivation has a lower SNR than directly sensing di/dt In the variant of FIG. 4, which is similar to the embodiment of FIG. 3b, soft magnetic corner elements 12 are provided at corners joining branches 8a, 8b, 8c, 8d of the Rogowski coil. The soft magnetic corner elements 12 magnetically short circuit discontinuities in the windings of the Rogowski coil formed by the corners that are present to adapt the path of the Rogowski coil to the outer profile of the primary conductor bus bar 2, 2a, 2b. This results in a better immunity to external fields.

The magnetic field gradient sensor in the embodiments in which it positioned in a slot, may advantageously be a single component, for instance a single ASIC (application specific integrated circuit) component.

The use of a single magnetic field gradient sensor is not only advantageous to reduce the cost of the transducer, but also reduces problems associated with combining signals from a plurality of sensors to output a measurement signal, due to possible differences in temperature or other environmental conditions at different positions where the plurality of sensors are located, or to slightly different properties and tolerances of each sensor.

Figure 5A:
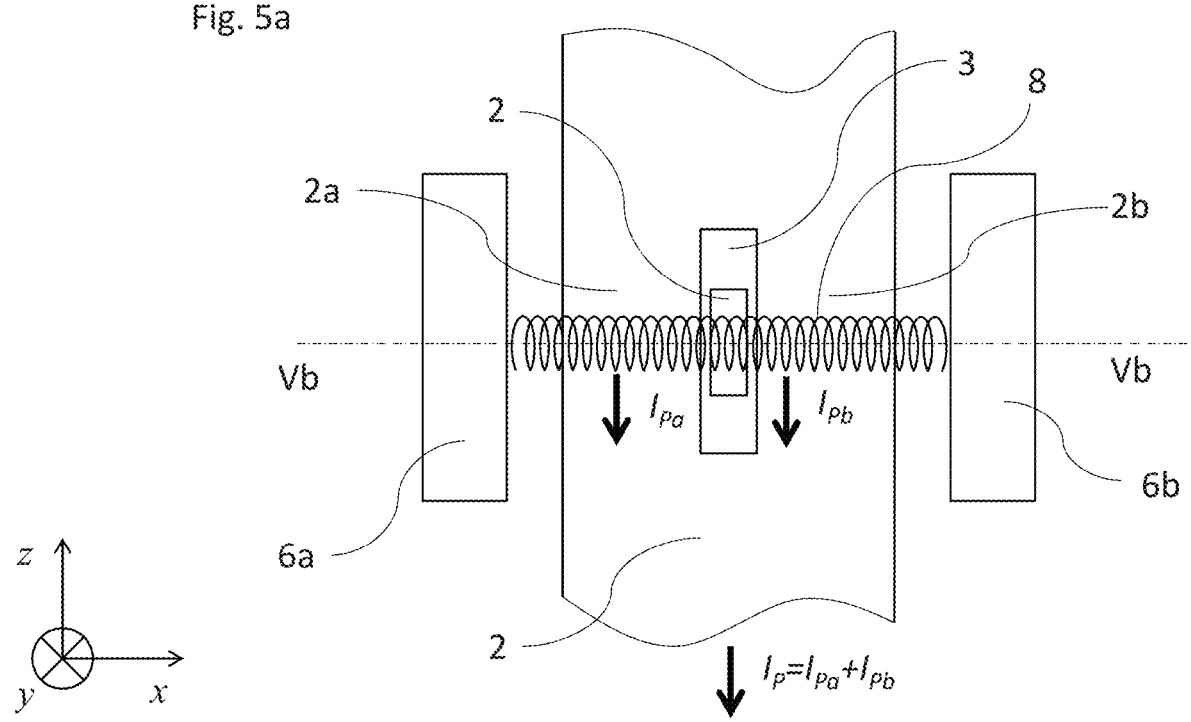
FIG. 5a is a simplified view of a primary conductor and electrical current transducer with magnetic field gradient sensor according to another embodiment of the invention.

Referring now to FIGS. 5a and 5b, another embodiment of a current transducer according to the invention is illustrated. In this embodiment, a primary conductor section 2, 2a, 2b, with slot 3, magnetic field gradient sensors 4a, 4b, and magnetic shims 6a, 6b are provided in a configuration similar to the embodiment of FIGS. 2a, 2b. In addition, a Rogowski coil comprises two Rogowski coil branches 8a, 8b extending between the magnetic shims 6a, 6b. The Rogowski coil branches extend fully from the first magnetic shim 6a to the other lateral magnetic shim 6b so as to form a bridge between the shims with essentially no interruption.

In addition to homogenizing the external magnetic field as previously described in relation to FIGS. 2a, 2b, the magnetic shims 6a, 6b also serve to provide a magnetic short circuit for the Rogowski coil 8a, 8b, resulting in better immunity to external fields.

The Rogowski coil 8 serves to measure the upper frequency range and the magnetic field gradient sensor serves to measure the lower frequency range in essentially the same manner as described above in relation to the FIGS. 3a, 3b, whereas the effects of external fields are homogenized and attenuated by the magnetic shims 6a, 6b in essentially the same manner as described above in relation to FIGS. 2a, 2b.

Figure 6:
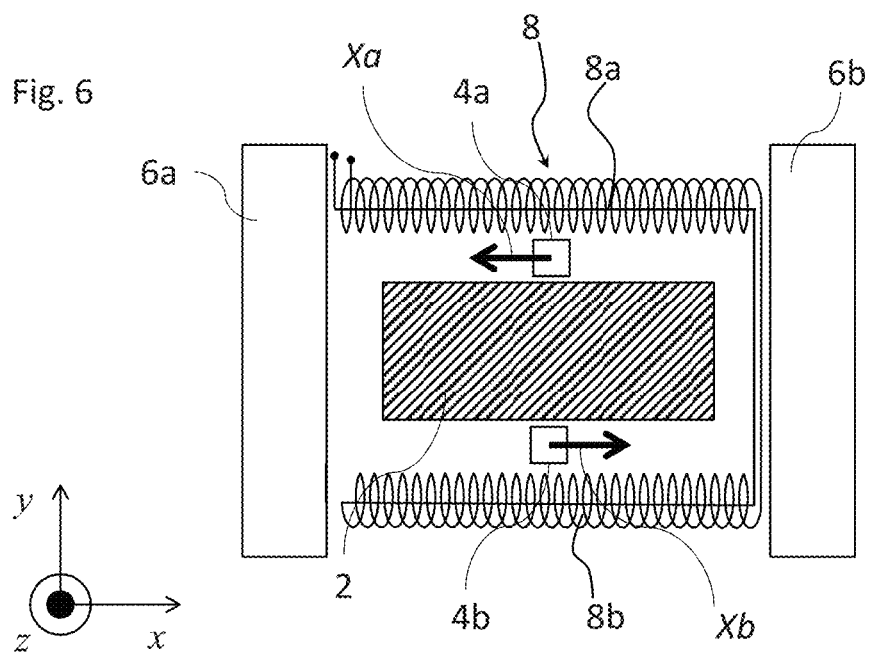
FIG. 6 is a simplified cross-sectional view of a primary conductor and electrical current transducer with magnetic field gradient sensor according to another embodiment of the invention.

Referring now to FIG. 6, another embodiment of a current transducer according to the invention is illustrated. In this embodiment, magnetic field gradient sensors 4a, 4b are positioned on opposite sides of a primary conductor section 2, and magnetic shims 6a, 6b are provided in a configuration similar to the embodiment of FIGS. 2a, 2b and 5a, 5b. In addition, a Rogowski coil comprises two Rogowski coil branches 8a, 8b extending between the magnetic shims 6a, 6b similar to the embodiment of FIGS. 5a, 5b. The Rogowski coil branches extend fully from the first magnetic shim 6a to the other lateral magnetic shim 6b so as to form a bridge between the shims with essentially no interruption. In addition to homogenizing the external magnetic field the magnetic shims 6a, 6b also serve to provide a magnetic short circuit for the Rogowski coil 8a, 8b, resulting in better immunity to external fields, as described above in relation to the FIGS. 5a, 5b.

The Rogowski coil 8 serves to measure the upper frequency range and the magnetic field gradient sensor serves to measure the lower frequency range whereas the effects of external fields are homogenized and attenuated by the magnetic shims 6a, 6b, as described above in relation to the FIGS. 5a, 5b.

It may be noted that the explanations based on dBx/dy in the present disclosure also apply to dBy/dx (because Rot (B)=J and J=0 in the areas of interest). According to an embodiment, the transducer may therefore be alternatively or in addition configured to measure the magnetic field gradient dBy/dx that is also transverse to the flow of the primary current.

The invention claimed is:

1. A current transducer comprising a section of a primary conductor, a magnetic field gradient sensor mounted in proximity to the primary conductor configured to measure a magnetic field gradient in a gradient measurement direction transverse to a current flow direction of a primary current ($I_P$) flowing in the primary conductor that enables measurement of said primary current ($I_P$), a first lateral magnetic shim mounted adjacent a first outer side of the primary conductor, and a second lateral magnetic shim mounted adjacent a second outer side of the primary conductor opposite the first outer side, a major internal surface of the first and second lateral magnetic shims facing the magnetic field gradient sensor and extending essentially parallel to the primary current flow direction, wherein the current transducer further comprises a first branch of a Rogowski coil mounted adjacent a third outer side of the primary conductor extending between the first and second lateral magnetic shims on, and a second branch of a Rogowski coil mounted adjacent a fourth outer side, opposite the third outer side, of the primary conductor extending between the first and second lateral magnetic shims.

2. The current transducer according to claim 1, wherein the lateral magnetic shims are substantially planar.

3. The current transducer according to claim 1, wherein the lateral magnetic shims are arranged substantially parallel to said gradient measurement direction.

4. The current transducer according to claim 1, wherein the primary conductor section is in the form of a section of solid bus bar incorporated in the electrical current transducer.

5. The current transducer according to claim 4, wherein the section of solid bus bar has a non-circular shape defining a width W between said first and second opposed outer sides, and a height H between said third and fourth opposed outer sides, the height being smaller than the width H<W.

6. The current transducer according to claim 5, wherein the section of solid bus bar has a substantially rectangular shape.

7. The current transducer according to claim 1, wherein the magnetic field gradient sensor comprises a first magnetic field detector oriented to sense magnetic flux in a first magnetic field direction transverse to the primary current flow direction, and a second magnetic field detector oriented to sense magnetic flux in a second magnetic field direction parallel but opposite to the first magnetic field direction, the first and second magnetic field detectors separated by a non-zero distance along the gradient measurement direction.

8. The current transducer according to claim 7, wherein said at least first and second magnetic field detectors are positioned on opposite first and second outer sides of said section of primary conductor.

9. The current transducer according to claim 1, wherein the magnetic field gradient sensor is positioned in a slot midway between two portions of said section of primary conductor, said slot extending between said first and second outer sides.

10. The current transducer according to claim 9, the first and second magnetic field detectors formed in a single component, for instance in a single application specific integrated circuit (ASIC).

11. The current transducer according to claim 4, wherein a height (Hm) of the lateral magnetic shims is at least twice a height (H) of the section of solid bus bar of the primary conductor.

12. A current transducer comprising a section of a primary conductor, a first magnetic field sensing system configured for measurement of a primary current ($I_P$) flowing in the primary conductor in a lower frequency range, and a Rogowski coil encircling said primary conductor configured for measuring said primary current ($I_P$) in an upper frequency range having frequencies greater than the lower frequency range, wherein the first magnetic field sensing system comprises a magnetic field gradient sensor mounted in a slot midway between two portions of said section of primary conductor, the magnetic field gradient sensor configured to measure a magnetic field gradient in a gradient measurement direction transverse to a direction of flow of the primary current.

13. The current transducer according to claim 12, wherein the primary conductor section is in the form of a section of solid bus bar incorporated in the electrical current transducer.

14. The current transducer according to claim 13, wherein the section of solid bus bar has a non-circular shape defining a width W between said first and second opposed outer sides, and a height H between said third and fourth opposed outer sides, and the height being smaller than the width H<W.

15. The current transducer according to claim 14, wherein the section of solid bus bar has a substantially rectangular shape.

16. The current transducer according to claim 12, wherein the magnetic field gradient sensor comprises a first magnetic field detector oriented to sense magnetic flux in a first magnetic field direction transverse to the primary current flow direction, and a second magnetic field detector oriented to sense magnetic flux in a second magnetic field direction parallel but opposite to the first magnetic field direction, the first and second magnetic field detectors separated by a non-zero distance along the gradient measurement direction.

17. The current transducer according to claim 12, wherein the magnetic field gradient sensor is formed in a single component, for instance in a single application specific integrated circuit (ASIC).

18. The current transducer according to claim 13, wherein a height (Hm) of the lateral magnetic shims is at least twice a height (H) of the section of solid bus bar of the primary conductor.

19. A current transducer comprising a section of a primary conductor, a magnetic field gradient sensor mounted in a slot midway between two portions of said section of primary conductor, configured to measure a magnetic field gradient in a gradient measurement direction transverse to a direction of flow of a primary current ($I_P$) flowing in the primary conductor that enables measurement of said primary current ($I_P$), a first lateral magnetic shim mounted adjacent a first outer side of the primary conductor, and a second lateral magnetic shim mounted adjacent a second outer side of the primary conductor opposite the first outer side, a major internal surface of the first and second lateral magnetic shims facing the magnetic field gradient sensor and extending essentially parallel to the current flow direction, the first and second lateral magnetic shims being substantially parallel, the magnetic shims arranged to attenuate the influence of external magnetic field gradients without increasing flux density generated by the primary current in the slot.

20. The current transducer according to claim 19, wherein the lateral magnetic shims are essentially planar.

21. The current transducer according to claim 19, wherein the primary conductor section is in the form of a section of solid bus bar incorporated in the electrical current transducer.

22. The current transducer according to claim 21, wherein the section of solid bus bar has a non-circular shape defining a width W between said first and second opposed outer sides, and a height H between third and fourth opposed outer sides, and the height being smaller than the width H<W.

23. The current transducer according to claim 22, wherein the section of solid bus bar has a substantially rectangular shape.

24. The current transducer according to claim 19, wherein the magnetic field gradient sensor comprises a first magnetic field detector oriented to sense magnetic flux in a first magnetic field direction transverse to the primary current flow direction, and a second magnetic field detector oriented to sense magnetic flux in a second magnetic field direction parallel but opposite to the first magnetic field direction.

25. The current transducer according to claim 24, wherein the first and second magnetic field detectors separated by a non-zero distance along the gradient measurement direction.

26. The current transducer according to claim 19, wherein the magnetic field gradient sensor is in a form of a single component, for instance a single application specific integrated circuit (ASIC).

27. The current transducer according to claim 21, wherein a height (Hm) of the lateral magnetic shims is at least twice a height (H) of the section of solid bus bar of the primary conductor.

* * * * *